United States Patent [19]

Yano et al.

[11] 4,352,089
[45] Sep. 28, 1982

[54] VOICE WARNING SYSTEM FOR AN AUTOMOTIVE VEHICLE

[75] Inventors: Hiroshi Yano, HigashiYamato; Masakazu Tsunoda, Fujisawa, both of Japan

[73] Assignee: Nissan Motor Company Limited, Kanagawa, Japan

[21] Appl. No.: 182,240

[22] Filed: Aug. 28, 1980

[30] Foreign Application Priority Data

Aug. 31, 1979 [JP] Japan .......................... 54-119115[U]

[51] Int. Cl.³ ........................................... H04B 15/00
[52] U.S. Cl. .................................. 340/52 F; 340/52 D
[58] Field of Search ............... 340/52 R, 52 D, 52 F, 340/31 R, 33, 34

[56] References Cited

U.S. PATENT DOCUMENTS

| 3,298,010 | 1/1967 | Dubosq et al. | 340/52 F |
| 3,732,536 | 5/1973 | Larka et al. | 340/33 |
| 3,870,818 | 3/1975 | Barton et al. | 179/1 SM |
| 3,909,842 | 9/1975 | Noji | 360/12 |

FOREIGN PATENT DOCUMENTS 2424065  5/1978  Fed. Rep. of Germany.
2714621  5/1978  Fed. Rep. of Germany.

*Primary Examiner*—Alvin H. Waring
*Attorney, Agent, or Firm*—Lowe, King, Price & Becker

[57] ABSTRACT

A voice warning system for an automotive vehicle wherein the voice output volume is automatically adjusted to an optimum sound level for the automotive vehicle driver according to the output volume level of audio equipment provided in the vehicle. The system thus improved comprises a memory for storing the volume adjustment level of the audio equipment and a voice volume controller for controlling the volume level of messages indicating various items of information on the automotive vehicle.

9 Claims, 4 Drawing Figures 4,352,089

VOICE WARNING SYSTEM FOR AN AUTOMOTIVE VEHICLE

BACKGROUND OF THE INVENTION

1. Field of the Invention

The present invention relates to a voice warning system for an automotive vehicle, and, more particularly, to a voice warning system which transmits various audible items of information necessary for the driver of the automotive vehicle.

2. Description of the Prior Art

Conventionally, pointer indications of various instruments and various warning lamps have been used as means for providing various items of information to the driver of an automotive vehicle. In addition, automotive vehicles have appeared in which a computer is provided having the ability to display selected information in a digital form. In either case, the information is transmitted to the driver visually. Conventional means for transmitting information audibly include devices for generating a variety of warning sound, such as a simple buzzer.

Such means for transmitting information visually is advantageous for simultaneous display of various items of information but comparatively poor at attracting the attention of the driver and poorly adapted to provide more complicated information to the driver.

On the other hand, such means for transmitting information audibly is effective in attracting the attention of the driver but can transmit only very simple information.

Recently, a voice warning system has been invented which transmits such various item of information as total distance traveled, and fuel consumption rate, in a speech form.

Using such a voice warning system enables the driver to understand the information promptly.

Since different drivers have different sensitivities of hearing and preference for volume level, some drivers may feel the volume to be too loud while others may feel the volume to be too quiet.

Incorporating a manual volume control for adjusting the volume level into such a warning system may produce problems of troublesome adjustment and difficulty in hearing the voice under lowest position of the manual volume control.

BRIEF SUMMARY OF THE INVENTION

It is an object of the present invention to provide a voice warning system for an automotive vehicle such that the volume level of speech information is controlled on a basis of the memorized volume adjustment position of audio equipment such as a radio set in an automotive vehicle, so as to transmit information at an optimum volume for the driver.

BRIEF DESCRIPTION OF THE DRAWINGS

The features and advantages of the voice warning system according to the present invention will be better appreciated from the following description taken in conjunction with the accompanying drawings in which like reference numerals designate corresponding elements, and in which.

DETAILED DESCRIPTION OF THE INVENTION

Reference will now be made to the drawings, and first to FIG. 1 which diagrammatically shows a first embodiment of the circuit arrangement of the present invention.

Figure 1:
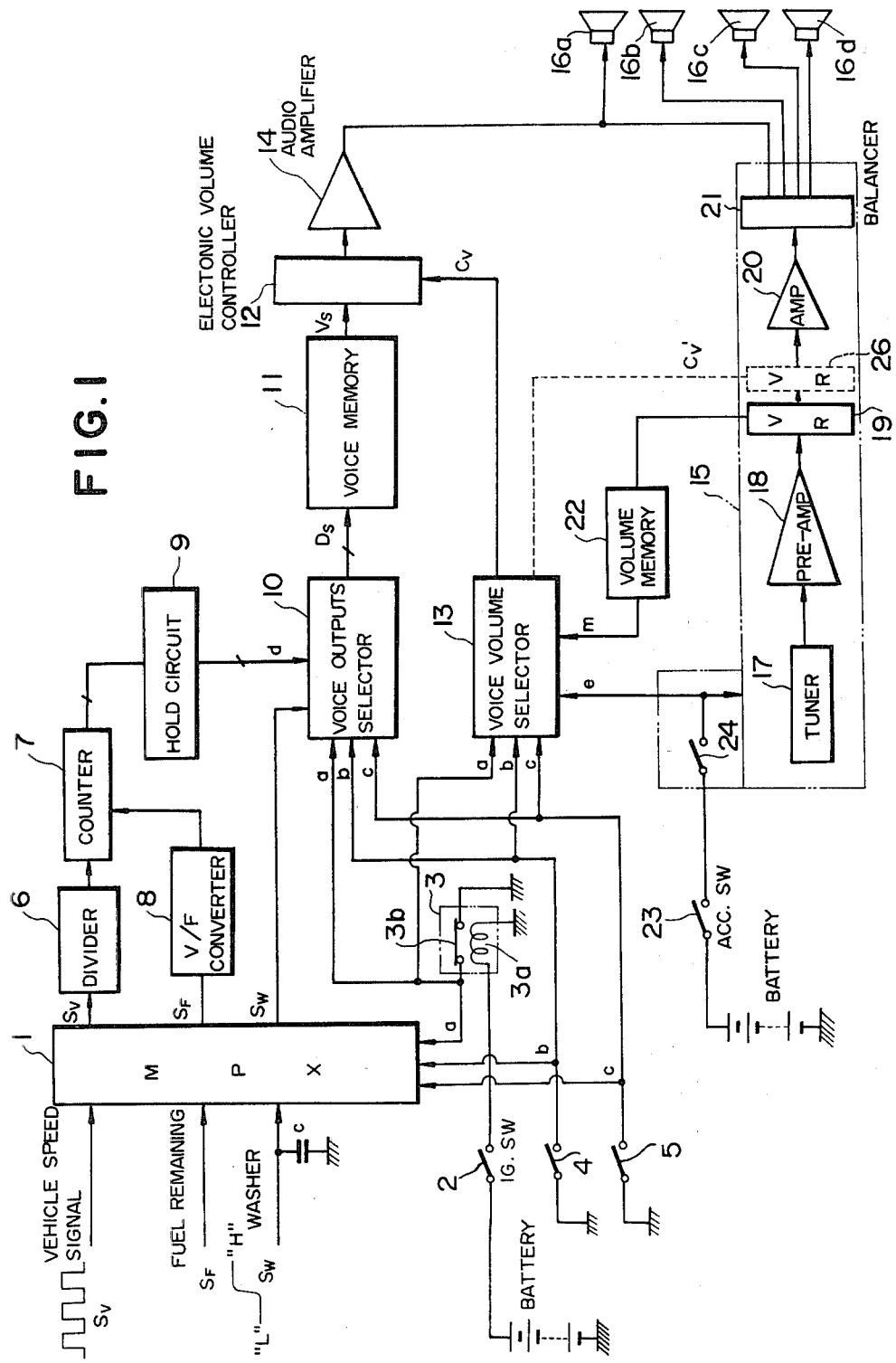
FIG. 1 shows a schematic block diagram of a first embodiment of the present invention.

In FIG. 1, numeral 1 denotes a multiplexer which inputs a vehicle speed signal $S_v$ whose pulse repetition rate corresponds to the vehicle speed, a fuel quantity signal $S_f$ proportional to the remaining quantity of fuel from the fuel sensor, and washer liquid quantity signal $S_w$ having two states of high level "H" and low level "L" and outputs selectively any one of $S_v$, $S_f$, and $S_w$ depending on which terminal of a, b, and c is grounded.

Numeral 2 denotes an ignition switch which is turned on to carry a current from a battery B to a relay coil 3a of a relay 3 to open its normally closed contact 3b, and is turned off to interrupt current to the relay coil 3a of the relay 3 with its normally closed contact 3b closed.

When the ignition switch is opened, the terminal a is grounded, so that the multiplexer 1 outputs a washer liquid quantity signal $S_w$. A capacitor C acts to hold the signal level of the washer liquid quantity signal $S_w$ for a sufficient delay period.

Numeral 4 denotes a trip switch which turns on to ground the terminal b to output the vehicle speed signal $S_v$ from the multiplexer 1.

Numeral 5 denotes a fuel quantity switch which when turned on ground the terminal c so that the multiplexer 1 outputs the fuel quantity signal $S_f$.

When the vehicle speed signal $S_v$ is outputted from the multiplexer 1, a divider 6 divides the frequency of the signal $S_v$ and a counter 7 connected to the divider 6 counts the signal and then outputs a signal to a hold circuit 9 every time the count reaches a predetermined number (e.g., corresponding to traveling a distance of 5 km). The hold circuit 9 hold information on the distance travelled.

When the multiplexer 1 outputs a fuel quantity signal $S_f$, a V/F converter 8 outputs a pulse signal whose frequency corresponds to the voltage of the signal $S_f$. The hold circuit 9 holds the counted value as the information on the remaining fuel.

Numeral 10 denotes a voice output selector having five input terminals connected to signals a, b, c, d and $S_w$ and one output terminal. The voice output selector 10 which determines what information the input data signal contains depending on which of the terminals a, b, and c are grounded and determines the presence or absense of the washer liquid, trip distance, and remaining quantity of fuel signals depending on the signal at the point d or level of the signal $S_w$. The speech output stored in a voice memory is selected according to the information outputted from the voice output selector 10.

The information from the voice output selector 10 is transferred in the form of a digital signal, indicating the message required. The contents of the various messages are such as "Top up washer liquid", "Distance travelled 10 km", and "Fuel tank is now half full".

The voice output selector 10 may be wired logic, or alternatively, micro-computer configuration.

Numeral 11 denotes a voice memory which holds messages in units of sentence, phrase, word or phone. The voice memory 11 outputs an analog voice signal $V_s$ selected from the stored data depending on the input signal $D_s$.

For the voice memory 11 may be used, for example, a device which plays back selectively different tracks of a tape on which messages corresponding to the input digital signal $D_s$ are recorded, in the case where there are only a few different messages to be transmitted.

However, in the case where there are many kinds of information to be transmitted and a large number of different possible messages, a system using such a magnetic recording unit not only requires more space but also takes time to access the selected track and becomes incapable of handling the number of messages required. To solve this problem it is convenient to use a voice synthesizer which uses a linear prediction coding system recently developed by Texas Instrument Incorporated. This voice synthesizer will be described hereinafter.

The voice signal $V_s$ outputted from the voice memory 11 is controlled by the volume control signal $C_v$ from a voice volume selector 13 by means of an electronic volume controller 12, amplified by an audio amplifier 14, and outputted by one of speakers 16a, 16b, 16c, and 16d of a radio set 15 provided in the automotive vehicle (In FIG. 1, the speaker 16a is used).

The radio set 15 comprises substantially a tuner 17, a pre-amplifier 18, a variable resistor (VR) 19 for adjusting the volume, an amplifier 20, and a balancer 21 (unnecessary in the case of a single speaker). Numeral 22 denotes a memory holding the volume level as set by means of the variable resistor 19 in the radio set 15. If the variable resistor 19 is an ordinary rotatable or slidable type variable resistor, the memory 22 may be a variable resistor of the same type as the variable resistor 19 which rotates or slides together with the variable resistor 19. If the variable resistor 19 is an electronic volume controller (externally controllable), the memory 22 can be any of various electronic non-refresh memories. Therefore, even when the power supply of the radio set 15 is turned off, the control setting of the variable resistor 19 is memorized. The volume signal m thus memorized is inputted to the voice volume selector 13. As an alternative, the variable resistor 19 itself in the radio set may serve as the voice memory 22 to read out the volume signal level from the voice volume selector 13 as necessary. Numeral 23 denotes an accessory switch incorporated with the ignition switch. Numeral 24 denotes a power supply switch for the radio set 15. Both switches 23 and 24 are turned on to activate the radio set 15. When tuned in the speakers 16a, 16b, 16c, and 16d produce sound at the volume adjusted by the variable resistor 19. To indicate whether the radio set 15 is on or not, a signal of power supply voltage to the radio set 15 from the power supply switch 24 is inputted to the voice volume selector 13. The voice volume selector 13 is a circuit which determines what type of message is to be produced, at what level the volume is adjusted in the radio set (for set the volume according to the driver's preference), and to what degree the voice output should be adjusted according to whether the radio set 15 is operating or not. In more detail, the voice volume selector 13 determines what should be informed depending on which of the points a, b, and c is grounded, detects at which level the volume is adjusted in the radio set 15 depending on the voice volume signal m memorized in the voice memory 22, determines the appropriate volume for the transmission of necessary information after judging whether the radio set 15 is activated or not from the presence or absence of the signal e, and finally controls the electronic volume controller 12 outputting a volume control signal $C_v$. The voice volume selector 13 and electronic volume controller 12 constitute a volume control circuit.

Figure 2:
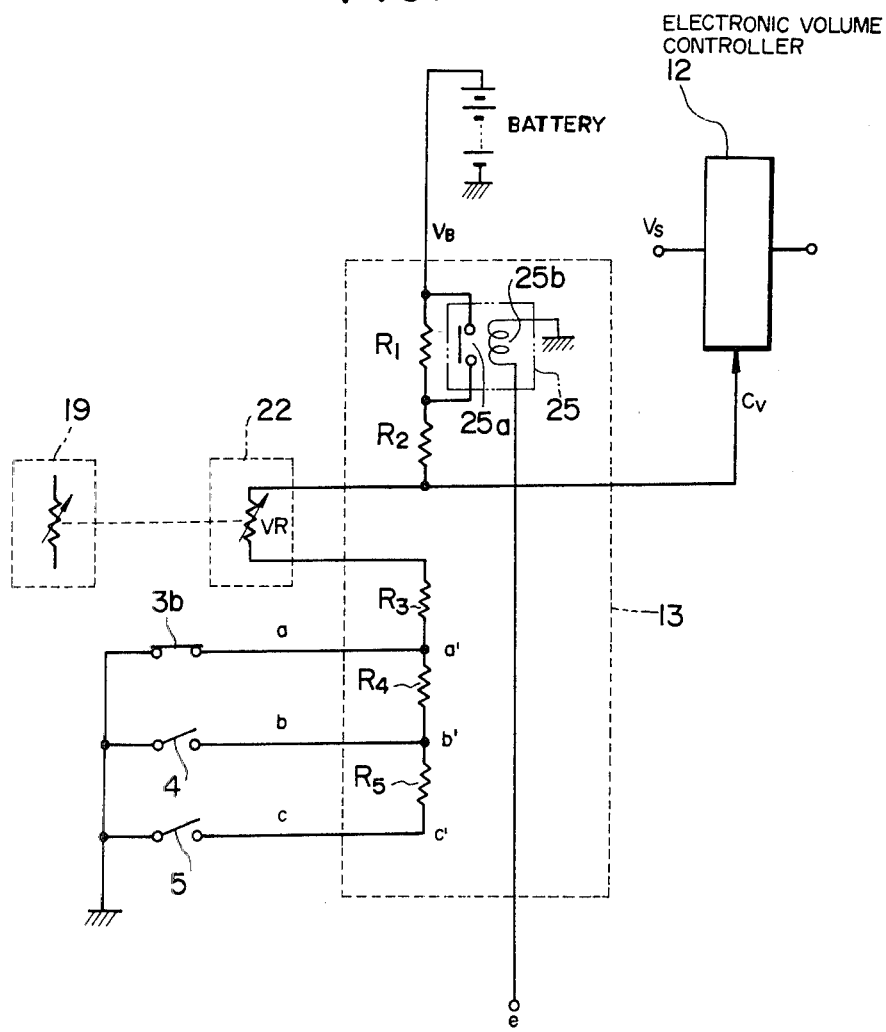
FIG. 2 shows one example of a voice volume selector shown in FIG. 1.

FIG. 2 shows a circuit drawing of an example of the voice volume selector 13. In this circuit, resistors $R_1$, $R_2$, $R_3$, $R_4$, and $R_5$ and variable resistor VR are connected in series to the positive pole of the battery B. A point a' between the resistors $R_3$ and $R_4$ is connected to ground via relay contact 3b. A point b' between the resistors $R_4$ and $R_5$ is connected to ground via a trip switch 4. A point c' below the resistor $R_5$ is connected to ground via the fuel quantity switch 5. Normally open contacts 25a of a relay 25 are connected across the resistor $R_1$. When the power supply voltage signal e is applied to a relay coil 25b, the normally open contact 25a is closed to short the resistor $R_1$. The volume control signal $C_v$ is outputted from a point g. The battery voltage B divided by the resistors $R_1$ through $R_5$ and the variable resistor VR is outputted as the volume control signal $C_v$. Therefore, when the resistance of the variable resistor VR is fixed and the relay 25 is turned off, the point a' is grounded with the relay contact 3b closed with the ignition switch 2 in FIG. 1 turned off so that the voltage at the point g is the lowest. When the trip switch 4 is turned on, the point b' is grounded so that the voltage at the point g is in the second lowest. When the fuel quantity switch 5 only is turned on, the point c' is grounded so that the voltage at the point g is the highest. If a voltage controlled type such as an FET is employed as the electronic volume controller, the higher the voltage of the volume control signal $C_v$, the less the attenuation of the voice signal $V_s$. Consequently, the volume of the voice is controlled in such a way that the washer liquid quantity information is at a rather low level, the trip information is at a middle level, and the fuel quantity information is at the loudest level.

In this case, since the washer liquid quantity information is produced when the automotive engine is stopped with the ignition switch turned off, the message can be heard even if its volume is somewhat low, because of less surrounding noise. The trip information is at a volume such that the driver can clearly distinguish the message from engine noise. The information on the fuel quantity at a somewhat louder level than that of the trip information since the message is produced only when the fuel quantity reaches a rather urgent level.

When the radio set 15 in FIG. 1 is operating, the resistor $R_1$ is shorted by the relay 25 energized by the signal e so that the voltage at the output point g is higher than described above. In all cases, the volume is considerably louder than described above so that the message can always be heard above the sound from the radio set 15. Furthermore, the resistance value of the variable resistor VR changes depending on the change in the variable resistor 19 of the radio set 15 in FIG. 2 so that the resistance value decreases when the volume of the radio set 15 is soft and the resistance value increases when the volume of the radio set 15 is loud. Therefore, the voltage at the point g changes according to the volume of the radio set 15. In addition, the electronic volume controller 12 can be controlled so that the voice to be informed is not cancelled by the voice from the radio set 15 and the information is transmitted in such a volume as to accord with the preference of the driver when the radio set is not operated.

As indicated by broken lines in FIG. 1, another electronic volume controller 26 may be inserted between the variable resistor 19 and amplifier 20 in the radio set 15. When the radio set 15 is operated, the voice volume selector 13 produces a second volume control signal $C'_v$ only when a message is produced to control the electronic volume controller 26 so that the volume of the radio set 15 is kept equal to or held somewhat less than the volume of speech information. The electronic volume controller 12 may be provided within the amplifier 14. In this case, the audio amplifier 14 may be a voltage-controlled variable gain amplifier (VCA).

Figure 3:
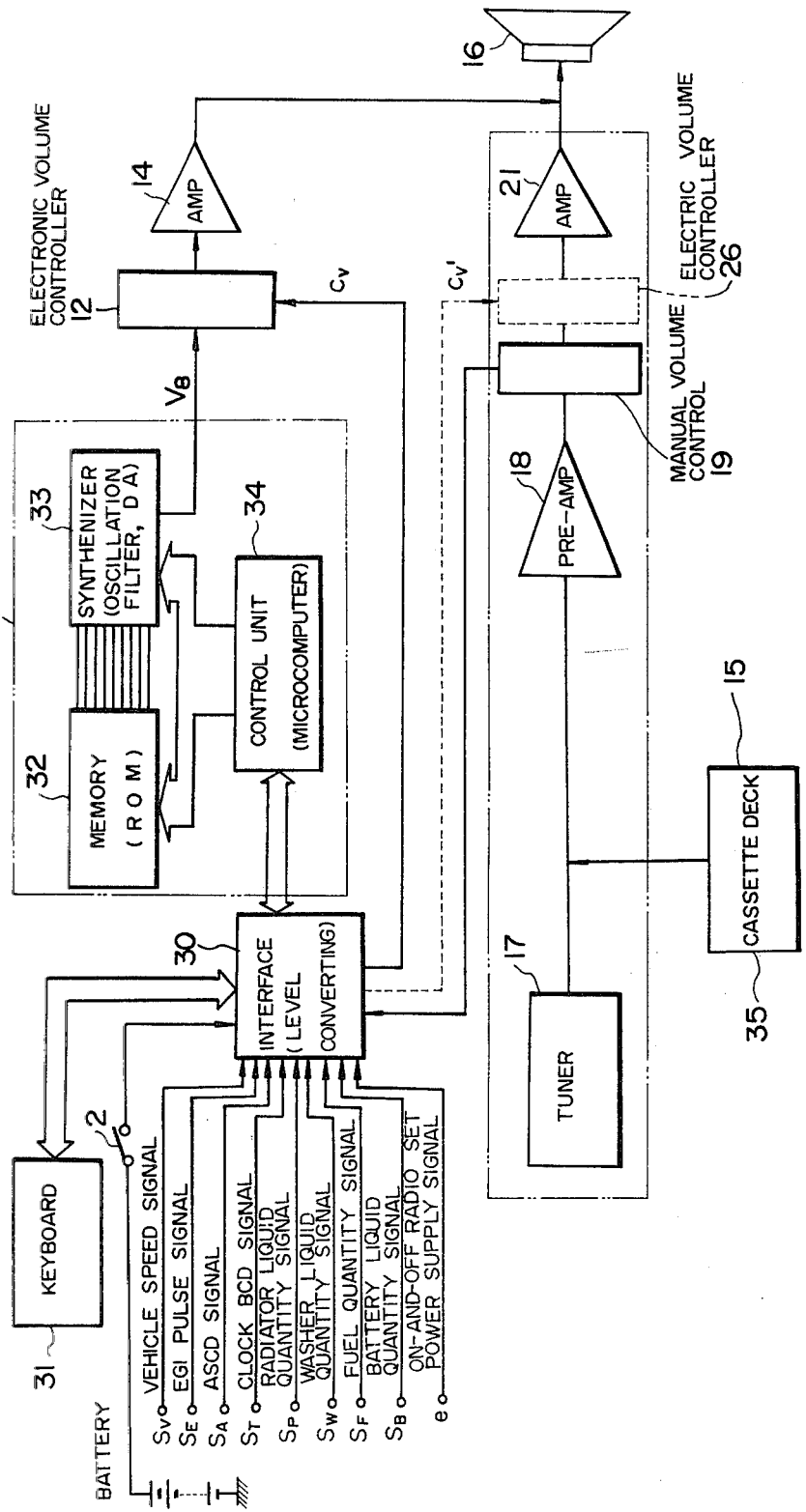
FIG. 3 shows a schematic block diagram of a second embodiment of the present invention.
Figure 4:
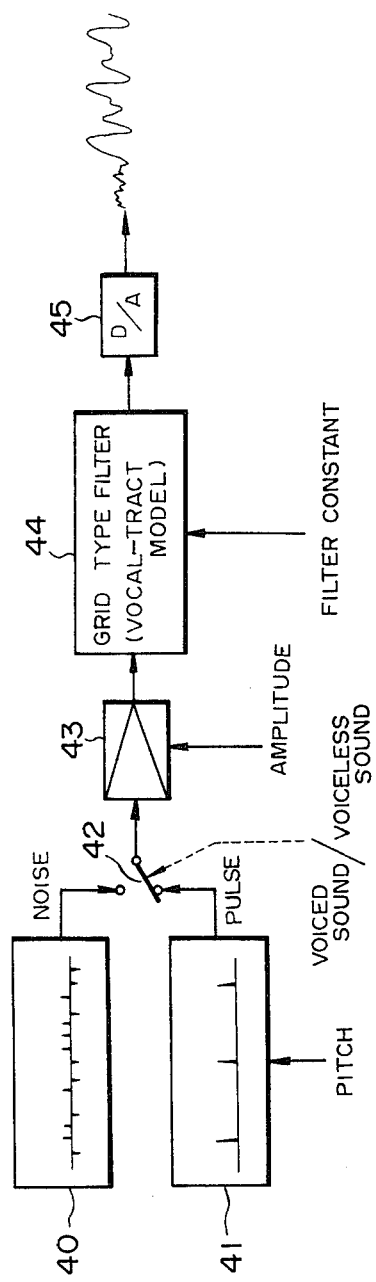
FIG. 4 shows a schematic block diagram of the second embodiment of the present invention which shows the theory of operation of the vocal synthesizer.

Reference is now made to FIGS. 3 and 4, where a second embodiment will be described. Portions of FIG. 3 which correspond to portions of FIG. 1 are indicated by the same reference numerals. Numeral 30 denotes an I/O interface of a microcomputer which incorporates signal level converters, A/D converters. The input signals to the interface are the on-off signal of the ignition switch 2 and power on-off signal e of the radio set 15 as well as the speed signal $S_v$, fuel liquid quantity signal $S_f$, and washer liquid quantity $S_w$ in the same way as in the first embodiment shown in FIG. 1. In this addition, the input signals of the interface are a EFI (electronic fuel injection) pulse signal $S_e$, an automatic speed control device signal $S_a$ indicating whether the automatic speed control device (ASCD) is operated or not, a signal $S_t$ indicating the time from an electronic clock, a radiator liquid quantity signal $S_r$ from the radiator liquid quantity sensor, and a battery liquid quantity signal $S_b$ from the battery liquid quantity sensor.

Numeral 31 denotes a keyboard, an alternative to switches 4 and 5 in the first embodiment, which can select various items of information which the driver desires to know by means of its numerous keys. Numeral 11' denotes a part which corresponds to the voice selector 11 shown in FIG. 1. A memory unit (ROM) 32, synthesizer 33, and control unit 34 constitute a voice synthesizer using a linear prediction coding (LPC) method. The control unit 34 is a micro-computer comprising a central processing unit (CPU), a memory (ROM) for storing both fixed data and programs, a memory (RAM) for storing the I/O data, and clock pulse generator. The control unit 34 operates in a time sharing mode including such functions in the data processor as the counter 7 in the first embodiment shown in FIG. 1, voice output selector 10, voice volume selector 13, and volume memory 22.

The principle of operation of the voice synthesizer will be hereinafter described with reference to FIG. 4.

A switch 42 provides a means for selecting either a pseudo random noise signal N from a first sound oscillator 40 for voiceless sounds or a regular impulse signal from a second sound oscillator 41 for voiced sounds. After the signal is amplified by the amplifier 43, a grid type filter 44 in which the resonance of the vocal tract is modeled during the generation of voice sound produces the voice sounds, which are outputted as a synthesized vocal signal converted to analog signal by a D/A converter 45.

The voice is synthesized depending on the pitch of the regular impulse signal, which of the voiced or voiceless sound is selected, amplification factor of the amplifier 43, and filter constant of the grid type filter 44, so that any phone can be synthesized. The required data is stored in the memory unit (ROM) in FIG. 3.

The synthesized vocal signal is outputted and controlled depending on the contents of output selected by the control unit 34.

The microcomputer control unit 34 determines the volume in the same way as the first embodiment, depending on which kind of information is to be transmitted, the level at which the manual variable resistor 19 is adjusted, and whether the radio set 15 is on or not, and outputs the volume control signal $C_v$ via the interface 30. If necessary, the second volume control signal $C_{v'}$ is outputted to control the electronic volume controller 26 in the radio set 15 so that the volume of the radio set 15 is decreased during the message output to transmit the information more clearly.

Numeral 35 denotes a cassette deck. It will be realized that determination of the driver's preference of volume level is not limited to a radio volume level. Equally a car stereo set, television or other audio instrument volume level may be detected. In the second embodiment, in addition to the trip information, fuel quantity information, and washer liquid information, the following items of information are transmitted: the fuel consumption from an EGI pulse signal, the remaining distance which the automotive vehicle can travel and remaining fuel quantity by means of the fuel quantity signal, the confirmation if the automatic speed control device is operating or not by means of an ASCD signal, time and average vehicle speed by means of a clock signal, and consumption of battery liquid by means of the battery liquid level signal.

In addition, the voice warning system is provided with a timer in the power supply for transmitting the washer liquid information even if the ignition switch is turned off. The timer is operated when the power supply is turned off. As set forth, the voice warning system for an automotive vehicle according to the present invention memorizes the volume adjustment level in an audio instrument such as a radio set provided in the automotive vehicle. The volume of the voice sound when a message is produced is controlled to be at an appropriate volume sufficient to transmit any information and suitable for the driver's preference. In the embodiments described above, the magnitude of the message output is controlled depending on which information is to be transmitted and depending on whether the audio equipment such as radio set is operating or not, so that fine volume control is made. Consequently, such problems as failure to hear, or noisy sound because the message is too loud can be solved.

It will be understood by those skilled in the art that the foregoing description is in terms of preferred embodiments of the present invention wherein various changes and modifications may be made without departing from the spirit and scope of the invention, which is to be defined by the appended claims.

What is claimed is:

1. A volume control system of a voice warning system for an automotive vehicle, comprising:
   (a) a volume setting means for setting a desired volume level of audio equipment provided in the vehicle;
   (b) means for holding the volume setting of said audio equipment; and
   (c) means for controlling the output volume of the voice warning system according to the sound volume setting of the audio equipment stored in said holding means so that the output volume level of the voice warning system is higher than that of the audio equipment, whereby the warning information can always be heard at an appropriate level above the sound volume of the audio equipment.

2. A volume control system of a voice warning system for an automotive vehicle, comprising:
   (c) a plurality of information switches;
   (d) an information selector for selectively outputting a signal indicating an item of information necessary for the automotive vehicle driver from various signals indicating vehicle operating conditions depending on either of which said information switches is turned on;
   (e) a volume level sensor for detecting the output volume level of an audio equipment provided in the automotive vehicle;
   (f) a memory for storing a volume setting of the audio equipment according to a signal from said volume level sensor;
   (g) a voice output selector for outputting a message containing the necessary information in accordance with the selected signal from said information selector; and
   (h) a voice volume controller for controlling the volume level of a message in response to a designation signal from said memory.

3. A volume control system of a voice warning system for an automotive vehicle as set forth in claim 2, wherein said information selector comprises:
   (i) a multiplexer for selectively outputting various information signals inputted from various sensors for detecting vehicle operating conditions to said voice output selector.

4. A volume control system of a voice warning system for an automotive vehicle as set forth in claim 2 or 3, wherein said voice volume controller comprises:
   (j) a voice volume selector for determining which item of information is to be produced, determining the volume level of a message in response to a designation signal from said memory and in response to a signal indicating whether the audio equipment is turned on or off, and outputting a volume control signal; and
   (k) an electronic volume controller for controlling the volume level of a message in response to the volume control signal from said voice volume selector.

5. A volume control system of a voice warning system for an automotive vehicle as set forth in claim 1, wherein said holding means comprises a variable resistor having a resistance value that varies with changes in an output value of said volume setting means for determining the output volume level of the audio equipment.

6. A volume control system of a voice warning system for an automotive vehicle as set forth in claim 1, wherein said holding means include said volume setting means and means for supplying a variable output voltage developed by said volume setting means to said output volume controlling means.

7. A volume control system of a voice warning system for an automotive vehicle as set forth in claim 1, which further comprises:
   (d) a voice output selector, and
   (e) a plurality of warning information switches controlling said voice output selector, each of said switches when turned on designating a respective type of warning information;
wherein said output volume controlling means comprises:
   (a) a voice volume selector connected to said warning information switches, to a power supply switch of the audio equipment, and to said holding means for outputting a voltage signal whose level is varied depending on the designation signal from one of said warning information switches, whether the power supply switch is turned on or off, and the sound volume setting stored in said holding means; and
   (b) an electronic volume controller controlling said voice volume selector for attenuating the level of a voice warning information signal to be outputted by the voice warning system according to the voltage signal from said voice volume selector so that its attenuation amount is reduced as the level of the voltage signal is increased.

8. A volume control system of a voice warning system for an automotive vehicle as set forth in claim 7, wherein said electronic volume controller includes a voltage controlled type attenuator using an FET, increasing attenuation amount of output level of the voice outputs selector inversely proportional to the level of the voltage signal from said voice volume selector.

9. A volume control system of a voice warning system for an automotive vehicle as set forth in claim 7, wherein said electronic volume controller is provided within an audio amplifying means of the voice warning system connected to the audio equipment output, both said electronic volume controller and audio amplifying means constituting a voltage controlled variable gain amplifying means.

* * * * *